United States Patent [19]
Han et al.

[11] Patent Number: 5,444,008
[45] Date of Patent: Aug. 22, 1995

[54] HIGH-PERFORMANCE PUNCHTHROUGH IMPLANT METHOD FOR MOS/VLSI

[75] Inventors: Yu P. Han, Dallas, Tex.; Samuel J. S. Nagalingam, Los Gatos, Calif.

[73] Assignee: VLSI Technology, Inc., San Jose, Calif.

[21] Appl. No.: 126,248

[22] Filed: Sep. 24, 1993

[51] Int. Cl.$^6$ .................................... H01L 21/266
[52] U.S. Cl. ......................... 437/45; 437/229; 148/DIG. 137
[58] Field of Search ................ 437/41, 45, 229; 148/DIG. 137

[56] References Cited
U.S. PATENT DOCUMENTS 4,564,584  1/1986  Fredericks et al. .......... 430/317
4,895,520  1/1990  Berg ................................ 437/45

*Primary Examiner*—Brian E. Hearn
*Assistant Examiner*—Chandra Chaudhari
*Attorney, Agent, or Firm*—Burns, Doane, Swecker and Mathis

[57] ABSTRACT

A method of making high performance MOSFETs uses image reversal lithography to make punchthrough implants.

11 Claims, 1 Drawing Sheet

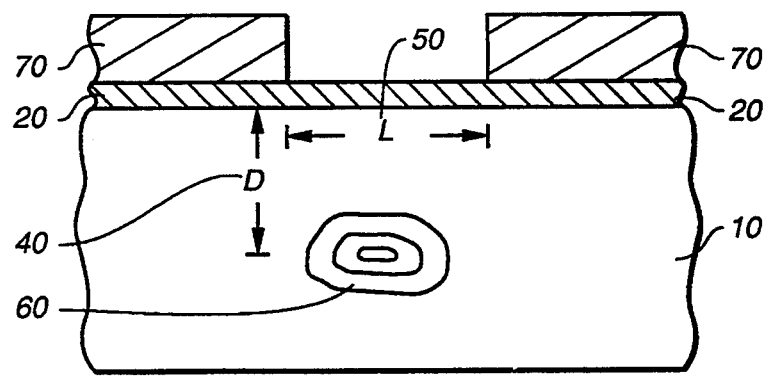
*FIG._1*
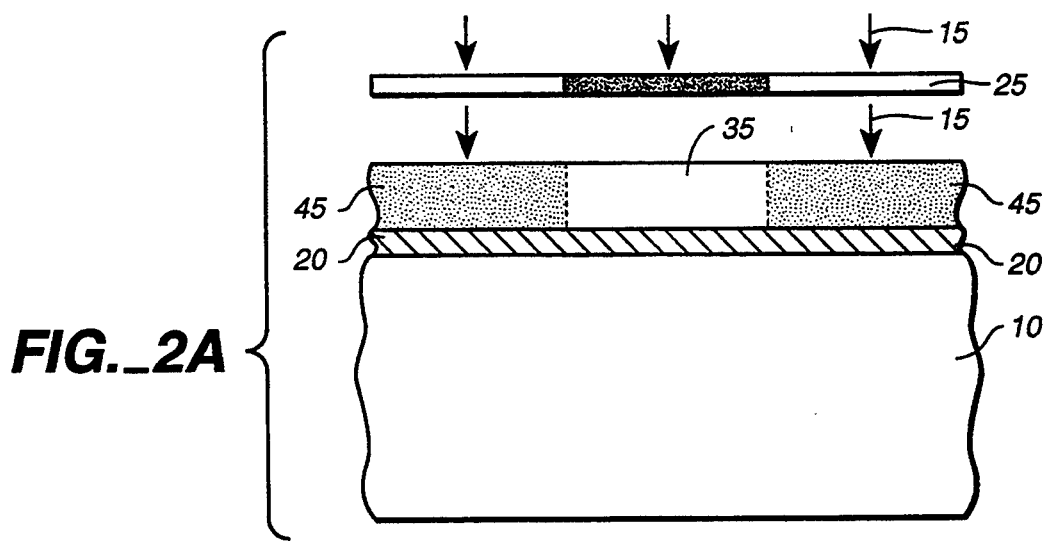
*FIG._2A*
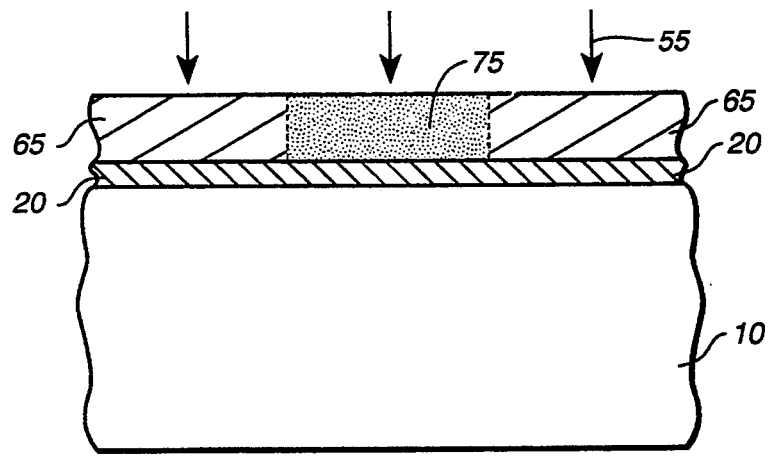
*FIG._2B*
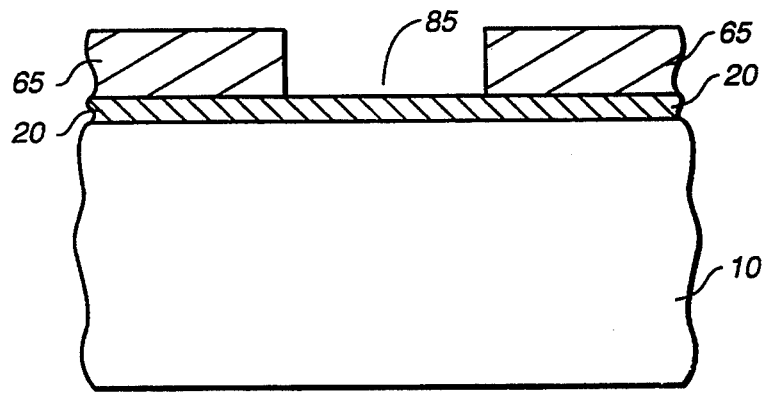
*FIG._2C*

HIGH-PERFORMANCE PUNCHTHROUGH IMPLANT METHOD FOR MOS/VLSI

FIELD OF THE INVENTION

This invention relates to MOSFET devices and methods for their manufacture.

REFERENCES The following references are cited in this specification for relevant disclosures.

1. S. Wolfe, et al., "Silicon Processing for the VLSI Era", Vol. 1, "Process Technology", Lattice Press, Sunset Beach, Calif., 1986.
2. S. Wolfe, "Silicon Processing for the VLSI Era", Vol. 2, "Process Integration", Lattice Press, Sunset Beach, Calif., 1990.

These citations are incorporated herein by reference in their entirety as if fully set forth in ipsis verbis.

BACKGROUND OF THE INVENTION

A major reason for the increased production and use of semiconductor devices is attributable to the dramatic reduction in production costs achieved by the electronics industry in converting silicon wafers into a large number of useful chips. By increasing the density of semiconductor devices on a single chip, costs are continually being reduced towards some limit. A great deal of effort has been focused on the design and fabrication of integrated circuits characterized by extremely complex circuitry reduced to a single chip. Such integrated circuits are commonly referred to as Very Large Scale Integration (VLSI) circuits.

The reduction in size and increase in complexity of the integrated circuitry means that ever more semiconductor devices are formed on a single chip in very small size. Principal among such devices are the MOSFETs in all their forms. As dimensions are reduced, a complex set of inter-related structural and electrodynamic problems have surfaced. Such problems arise from the existing electrical properties of semiconductors which are not critical in larger devices spaced further apart in an integrated circuit. These problems include parasitic capacitances and resistances, and punchthrough currents. Undesirable changes in MOSFET response characteristics occur when the source to drain spacing is reduced, especially when reduced below 2 microns, and some current devices use spacings of less than 1 micron. These changes are significant when the depletion regions surrounding the source and drain extend into the silicon substrate under the gate and the depletion regions merge. Reference 2 at pages 298–452 addresses the fabrication of MOSFETs in terms of NMOS, PMOS, and CMOS devices, the disclosure of which is incorporated herein by reference.

Depletion layers are directly affected by the voltage on the device and the substrate doping level. If the depletion layers merge, electric lines of force run directly from the drain to the source through the substrate and a condition called "punchthrough" exists. Punchthrough is evidenced by a current between the source and the drain which is not controlled by the gate. Punchthrough is normally observed when the gate voltage is well below the threshold voltage. It occurs as a result of the widening of the drain depletion region when the reverse-bias voltage on the drain is increased. The electric field of the drain may eventually penetrate into the source region and thereby reduce the potential energy barrier of the source-to-body junction. When this occurs more majority carriers in the source have enough energy to overcome the barrier and an increased current then flows between the source and the body. Some of this current is collected by the drain. In general, punchthrough current begins to dominate the current between the drain and the substrate when the drain and source depletion regions meet. It can be suppressed by keeping the total width of the two depletion regions smaller than the channel width. Thus, punchthrough current flows beneath the surface and is not controlled by the threshold voltage, or the gate voltage in general.

Punchthrough current is a particularly severe problem in short-channel MOSFETs because the source and the drain are closer together and their depletion regions more easily overlap. A means to prevent punchthrough current, which will be discussed further hereinbelow, is to increase the doping of the substrate which tends to decrease the depletion layer widths. However, increased substrate doping causes lower junction breakdown voltages, larger junction capacitance and lower carrier mobilities. Prior to ion implantation, the adjustment of substrate doping was the only practical process to control punchthrough. The lower the doping concentration in the body of the device, the lower the junction capacitance, and lower junction capacitance is in general beneficial.

Thus while the problems here and above described are brought on, in part, by decreasing the distance between the source and the drain (reduction in channel length) the electrical length of a channel can be effectively increased by increasing the distance between the source and the drain depletion regions and this in turn is accomplished by ion implantation under the channel, as well as by other means.

It is believed that a deeper ion implant would reduce the susceptibility of the device to punchthrough, but the question remains as to how to carry out the implantation without increasing the junction capacitance.

Examples of junction capacitance are source-body capacitance and drain-body capacitance. Higher capacitance means longer times to charge and discharge the device and slower switching speed of the logic gates in a MOSIC.

Ion implantation has been widely used to adjust the threshold voltage of the MOSFET. The development of ion implantation for threshold voltage adjustment removed the last obstacle for reliable production of the n-channel devices for MOSICs, because this permits one to choose the body (substrate) doping level without consideration of its impact on the threshold voltage. Thus high performance MOS circuits can be reliable fabricated on lightly-doped substrates. In this technique, implantation of boron, phosphorotis or arsenic ions is made into the regions under the oxide of a MOSFET. The implantation of boron (an acceptor) causes a positive shift in the threshold voltage because there are more holes to drive out of the channel and more holes to recombine with electrons before the n-channel is established. Likewise, P and As give a negative shift to the threshold voltage. Typically, ions are implanted near the surface at less than 0.3 microns below the gate oxide, and they are implanted through the gate oxide layer. This may be followed by an implant-activating anneal which deepens the implant slightly. It is found that $5 \times 10^{11}$ ions/cm$^2$ will shift the threshold voltage by approximately 0.58 V.

Reference 2, at page 342, shows how ion implantation when used to adjust the threshold voltage causes the drain depletion region to be wider in the bulk than it is near the gate oxide interface. As a result, punchthrough current flows below the surface, and consequently, gate voltage has less control over the subthreshold current. Even with enough gate voltage to turn off the channel, punchthrough current can still flow in such devices. An enhancement-mode device which is not turned off when the gate voltage is zero loses its ability to function as a switch.

To prevent punchthrough in short-channel devices the substrate doping can be increased, sometimes called "blanket-doping". This decreases the depletion-layer width but increases the junction capacitance.

To avoid the drawback of blanket doping, an additional boron implant (whose peak concentration is located at a depth near the bottom of the source-drain regions) can be performed. This additional doping reduces the lateral widening of the drain-depletion region below the surface without increasing the doping under the junction regions. With such implants, the punchthrough current can be suppressed to well below the normal drain-substrate current of the device.

If the implant is too shallow, the extra implant will have the effect of shifting the threshold voltage of the device to well beyond a desirable value. If the energy of the ion gun is increased so that the implant is sufficiently deep, the value of drain-substrate current drops to that exhibited by long channel devices. At the same time the surface concentration of dopants remains unchanged so that the threshold voltage is not appreciably shifted.

It would be advantageous to maintain low doping levels in the substrate while controlling punchthrough current. It would be advantageous if implementation technology could be used to provide insulated gate field effects transistors capable of operating at high speed. It would be more advantageous if the MOSFET were also a short channel device without detectable punchthrough current, which is typically difficult to achieve in short channels. It would also be advantageous to avoid high junction capacitance thereby permitting high speed operations of the device. It would be even more advantageous to find a method of fabricating such a transistor by simple means which do not require complex operations.

SUMMARY OF THE INVENTION

The present invention is directed to the fabrication of high-performance metal-oxide-semiconductor field-effect transistor devices by means of the method including the following steps:

(a) providing a p-doped silicon substrate for the device;

(b) forming a patterned thin layer of silicon dioxide on the surface of said substrate to serve as gate oxide;

(c) placing a positive photoresist layer on the surface of the device;

(d) by means of image reversal photolithography, opening an aperture in said photoresist, said aperture defining a gate region;

(e) implanting a p-type dopant in said substrate below said thin oxide layer in said gate region;

(f) removing residual photoresist.

In the fabrication of a MOSFET, the additional steps include the forming of a patterned layer of polysilicon on the surface of the device, as well as providing a n-doped source region and a n-doped drain region on opposite sides of and adjacent to the gate region by ion implantation.

The photolithographic image reversal means comprises the steps of placing a reverse gate mask over the photoresist; exposing the photoresist to UV light; neutralizing the photo-products in the exposed region of the photoresist; flooding entirely the photoresist with UV light; and developing the photoresist to remove the portion of the photoresist exposed in the latter light-flooding step.

Preferably, the p-doped silicon substrate is lightly doped, the n-doped source region is heavily doped, and the n-doped drain region is also heavily doped. The p-type dopant used in the punchthrough implantation step of the present invention is boron when the device being fabricated is a NMOS. In a preferred embodiment the boron is implanted by means of a high energy ion beam to a dosage of from about $10^{13}$ to about $10^{15}$ atoms/cm$^2$. Preferably, the boron is implanted under conditions which evidence a maximum distribution of boron atoms at a distance below the surface of the substrate in the range of from about 0.3 microns to about 0.6 micron.

In a fabrication process for a MOSFET device additional steps include the implanting of a shallow channel of n-dopants in the gate region for the purpose of controlling the threshold voltage; and the additional step of depositing a layer of polysilicon on the surface of the gate oxide, as well as many additional steps which are known to those of skill in the art of MOSFET fabrication.

The present invention has been described in terms of the fabrication of a NMOS, but it is evident that with suitable changes of dopants the fabrication process is of great generality in the manufacture of MOSFETs. In consequence, the present invention includes the transistor made according to the process of the present invention.

BRIEF DESCRIPTION OF THE DRAWINGS

FIG. 1 is a profile of a MOSFET at an early stage of fabrication, after implantation of the deep and localized punchthrough implant by the method of this invention.

FIG. 2-A is the first step in the gate image reversal means selected for isolation of the gate region.

FIG. 2-B is the second step in gate image reversal means.

FIG. 2-C is the result of gate image reversal photolithography.

DETAILED DESCRIPTION OF PREFERRED EMBODIMENTS OF THE INVENTION

Referring now to the drawing, FIG. 1 depicts a semiconductor substrate, 10, preferably silicon lightly doped with p-type atoms to about $10^{15}$ atoms/cm$^3$, over which has been formed a dielectric film, 20, which is preferably silicon dioxide. The oxide film is of thickness in the range of from about 50 Å to about 200 Å (0.1 micron). On the surface of the oxide is formed a patterned photoresist, 70, by image reversal photolithography, having a thickness of approximately 1 micron. While the silicon substrate is shown here to be doped with a p-type material on which NMOS devices can be fabricated, it should be understood that n-type silicon may be employed as a substrate for fabricating PMOS devices and appropriate wells of p- and n-doped silicon can be formed to provide CMOS devices. The corresponding changes in the process set forth below would then be made.

FIG. 1 shows a distribution of implanted dopant atoms. The maximum of the distribution is shown at a distance, 40, D microns below the oxide layer. D will have a value in the range of from about 0.3 microns to about 0.5 micron. The concentric lines, 60, represent the dopant's equidensity lines which decrease from the center of the distribution of implanted ions. The total concentration of dopant, e.g., boron, is normally a dosage of from about $10^{10}$ atoms/cm$^2$ to about $10^{13}$ atoms/cm$^2$. The implant is localized substantially directly under the gate region. The length of the gate, 50, i.e. L has a value less than 2 microns, preferably less than 1 micron. Simple experimentation is adequate for determining the particular conditions needed to establish the desired doping profile. For example, for a film of silicon oxide 100 Å thick, a boron implant at a dosage of $1 \times 10^{13}$ atoms/cm$^2$ at about 200 keV is sufficient to provide the desired profile without penetration of the photoresist by implant ions. The result is a maximum concentration range of boron atoms from about $10^{17}$ atoms/cm$^3$ to about $10^{18}$ atoms/cm$^3$. Other conditions are selectable, within the skill of the art, for similar purposes. Reference 1, pages 280–330, is cited for the disclosure of ion implantation methods and it is incorporated herein by reference.

Precaution indicates that to prevent migration of the boron implant shown in FIG. 1 it is useful to use a reduced thermal budget to restrict the boron diffusion. By implanting boron through the gate oxide the oxidation-enhanced diffusion of boron that would occur on growth of the gate oxide is avoided. It may be necessary to prevent the gate oxide from becoming contaminated during implant, either by materials sputtered by the beam or by vaporized resist material used as a mask against the implant. To prevent such contamination, a thin layer of polysilicon may be deposited on the gate oxide prior to the implant. Preferably, after the implant has been performed, the remainder of the polysilicon film is deposited. Preferably, this polysilicon is doped during the deposition step as required.

FIG. 2-A is a profile of the photolithographic steps undertaken to prepare the substrate for a punchthrough implant. The process is referred to as an "image reversal photolithography means". First, a layer of positive photoresist, 35, is formed on the silicon dioxide layer, 20, which is formed on the silicon substrate, 10. Positive photoresist is characterized by its removability upon exposure to UV light followed by development. Reference 1, pages 407–458, is cited for the disclosure of lithographic methods and it is incorporated herein by reference. Next a patterned mask, 25, is used to form an image with the UV light, 15, on the surface of the photoresist, 35, exposing only regions, 45, of the photoresist. In this context, "exposing" means the formation of photoproducts which upon development lead to dissolution of the resist film.

In the next step, the photo-products in the exposed regions of the photoresist are neutralized as shown in FIG. 2-B as 65, and the entire device is flooded with UV light 55. The unprotected region of the resist, 75, is now exposed and upon development dissolved to provide the aperture in FIG. 2-C denoted by 85. The neutralized photoresist does not dissolve in the developer. Examples of the process are discussed in Reference 1, pages 421–423, the disclosure of which is incorporated herein by reference. The aperture 85 is suitable to define the gate region of the MOSFET, ready for ion implantation of a punchthrough implant.

The present invention provides high performance metal-oxide-semiconductor field-effect transistors. That is, a single implant is used to prevent punchthrough without the need to raise the entire substrate-doping concentration. By incorporating this and additional implants it is possible to build higher performance devices than can be achieved by blanket doping of the substrate in terms of reduced junction capacitance. Significant increases in substrate-doping concentrations give rise to lower junction breakdown voltages, larger junction capacitances, and lower carrier mobilities, making such substrate doping concentration increasingly undesirable.

The switching speed of the logic gates in a MOSIC is limited only by the time required to charge and discharge the capacitances between device electrodes and between the interconnecting lines and ground. At the circuit level, the propagation delay is frequently limited by the interconnection-line capacitances. But at the device level, the gate delay is determined primarily by the channel transconductance, the MOS gate capacitance and the MOS parasitic capacitances, i.e. that between the drain and the body, and that between the source and the body. If these capacitance values can be reduced, the device switching speed will be increased.

While the gate capacitance is greatly decreased by decreasing the gate area, the dominant parasitic capacitances on the device level are the junction capacitances between the source and the body and between the drain and the body. These capacitances can account for up to 50% of the total capacitance in logic gates. Therefore, counter reductions in these capacitances should produce corresponding decreases in the gate delay. In general, the lower the doping concentration in the substrate, the lower the junction capacitances.

In the process of the present invention as heretofore described, the active region and the field regions have been defined by the location of the gate region. In subsequent major steps, threshold voltage is adjusted by implantation of ions, polysilicon is deposited and patterned, the source and drain regions are formed, contact formation is completed, metalization, deposition and patterning is carried out, and finally the passivation layer is formed and the bonding pads are opened.

A particular example of the image reversal process for a positive resist has been given by E. Alling and C. Stauffer, in the Proceedings SPIE, Vol. 539, "Advances in Resist Technology and Processing II", Mar. 11, 1985, page 194. In this particular process, after the first exposure, the resist layer is subjected to amine vapors. The amine diffuses through the resist and reacts with the carboxylic acid photoproduct in the exposed resist areas. The process is conducted in a vacuum bake chamber, which allows the amine vapors to be uniformly delivered to the resist and for the temperature to be uniformly controlled to $\pm 1.5°$ C. Following the amine vapor treatment, a second flood UV exposure at high doses is performed and the resist is developed in a conventional manner. The process reportedly provides resolution equal to that obtainable for positive resist images, gives good critical dimension control, good contrast, and adequate depth of focus. It also has the potential for allowing the slope of the resultant images to be controlled without the film thickness normally present in conventional positive resist processing. It should be noted that the present disclosure has been made by way of example and that numerous other changes in details of construction including the combination and arrangement of elements, as well as other fabrication steps and their sequence of implementation, may be resorted to, without departing from the true spirit and scope of the invention as hereinafter claimed.

What is claimed is:

1. A method of making a high performance metal-oxide-semiconductor field-effect transistor device comprising the steps of:
   a) providing a p-doped silicon substrate for the device;
   b) forming a patterned layer of silicon dioxide on the surface of said substrate to serve as gate oxide;
   c) placing a positive photoresist layer on the surface of the device
   d) by means of image reversal photolithography opening an aperture in said photoresist, said aperture defining a gate region, wherein the step of opening the aperture comprises the steps of:
      (i) placing a reverse gate mask over said photoresist;
      (ii) exposing said photoresist to UV light;
      (iii) neutralizing the photoproducts in the exposed region of said photoresist;
      (iv) flooding entirely said photoresist with UV light; and
      (v) developing said photoresist to remove the portion of the photoresist exposed in step (iv);
   e) implanting a p-type dopant in said substrate below said oxide layer in said gate region; and
   f) removing residual photoresist.

2. A method according to claim 1 comprising the additional steps of:
   forming a patterned layer of polysilicon on the surface of said device; and
   providing an n-doped source region and an n-doped drain region on opposite sides of and adjacent to said gate region by ion implantation.

3. A method according to claim 1 wherein said p-doped silicon substrate is lightly doped and said n-doped source region and said n-doped drain region are heavily doped.

4. A method according to claim 1 wherein said p-type dopant is boron.

5. A method according to claim 4 wherein said boron is implanted by means of an energy ion beam to a dosage of from about $10^{13}$ to about $10^{15}$ atoms/cm$^2$.

6. A method according to claim 5 wherein said boron is implanted under conditions which evidence a maximum distribution of boron atoms at a distance below the surface of said substrate in the range of from about 0.3 microns to about 0.6 micron.

7. A method according to claim 1 comprising the additional step of implanting a shallow channel of n-dopants in said gate region for the purpose of controlling the threshold voltage.

8. A method according to claim 1 comprising the additional step of depositing a layer of polysilicon on the surface of said oxide in said gate region.

9. A method of making a high performance metal-oxide-semiconductor field-effect transistor device comprising the steps of:
   a) providing a n-doped silicon substrate for the device;
   b) forming a patterned layer of silicon dioxide on the surface of said substrate to serve as gate oxide;
   c) placing a positive photoresist layer on the surface of the device;
   d) by means of image reversal photolithography opening an aperture in said photoresist, said aperture defining a gate region, wherein the step of opening the aperture comprising the steps of:
      (i) placing a reverse gate mask over said photoresist;
      (ii) exposing said photoresist to UV light;
      (iii) neutralizing the photoproducts in the exposed region of said photoresist;
      (iv) flooding entirely said photoresist with UV light; and
      (v) developing said photoresist to remove the portion of the photoresist exposed in step (iv); and
   e) implanting a n-type dopant in said substrate below said oxide layer in said gate region;
   f) removing residual photoresist.

10. A method according to claim 9 comprising the additional steps of:
    forming a patterned layer of polysilicon on the surface of said device; and
    providing a p-doped source region and a p-doped drain region on opposite sides of and adjacent to said gate region by ion implantation.

11. A method according to claim 9 wherein said n-doped silicon substrate is lightly doped and said p-doped source region and said p-doped drain region are heavily doped.

* * * * *